US007639500B2

(12) United States Patent  (10) Patent No.: US 7,639,500 B2
Lang et al.  (45) Date of Patent: Dec. 29, 2009

(54) MOUNTING PLATE FOR ELECTRONIC COMPONENTS

(75) Inventors: Martin Lang, Driedorf (DE); Wolfgang Reuter, Burbach (DE); Horst Besserer, Herborn (DE); Ahmet Savasci, Wetzlar (DE)

(73) Assignee: Rittal GmbH & Co. KG, Herborn (DE)

( * ) Notice: Subject to any disclaimer, the term of this patent is extended or adjusted under 35 U.S.C. 154(b) by 491 days.

(21) Appl. No.: 10/572,998

(22) PCT Filed: Apr. 8, 2005

(86) PCT No.: PCT/EP2005/003694

§ 371 (c)(1),
(2), (4) Date: Mar. 23, 2006

(87) PCT Pub. No.: WO2005/101939

PCT Pub. Date: Oct. 27, 2005

(65) Prior Publication Data
US 2008/0232065 A1  Sep. 25, 2008

(30) Foreign Application Priority Data
Apr. 19, 2004 (DE) .................. 10 2004 019 382
Apr. 19, 2004 (DE) .................. 20 2004 017 950 U
Nov. 18, 2004 (DE) .................. 10 2004 055 815

(51) Int. Cl.
 H05K 7/20 (2006.01)
 F28D 15/00 (2006.01)
(52) U.S. Cl. ............ 361/702; 361/704; 361/707; 165/80.4; 165/104.33
(58) Field of Classification Search ........ 361/688, 361/699, 702, 711, 715, 716, 689, 704, 707; 165/80.4, 104.33
See application file for complete search history.

(56) References Cited

U.S. PATENT DOCUMENTS 3,218,519 A * 11/1965 Casey .................. 361/656
3,398,249 A * 8/1968 Dessert ................ 200/294
3,743,892 A * 7/1973 Fritz et al. ............. 361/652

(Continued)

FOREIGN PATENT DOCUMENTS

DE  82 17 810.0  1/1983

(Continued)

OTHER PUBLICATIONS

Fischer Elektronik GmbH & Co. KG Specification Sheet, 3 pages, Nov. 2002.

(Continued)

Primary Examiner—Jayprakash N Gandhi
Assistant Examiner—Robert J Hoffberg
(74) Attorney, Agent, or Firm—Pauley Petersen & Erickson

(57) ABSTRACT

A mounting plate for electronic components, including cooling conduits that are integrated into a plate body and that are traversed by a coolant, and a fixing device for mounting the electronic components being located on the plate body. The fixing device includes at least one retaining piece and a first recessed groove or channel that extends in a linear manner in the direction of extension of the mounting plate. A retaining piece, which includes a fixing thread, for securing the component can be inserted into the groove or channel.

23 Claims, 5 Drawing Sheets

U.S. PATENT DOCUMENTS

| | | | |
|---|---|---|---|
| 4,351,620 A * | 9/1982 | Stritt et al. | 403/13 |
| 5,263,538 A | 11/1993 | Amidieu et al. | |
| 5,546,274 A | 8/1996 | Davidson | |
| 5,761,043 A * | 6/1998 | Salmonson | 361/707 |
| 5,870,284 A * | 2/1999 | Stewart et al. | 361/699 |
| 5,943,207 A * | 8/1999 | Kim | 361/673 |
| 6,421,240 B1 * | 7/2002 | Patel | 361/699 |
| 7,028,389 B2 * | 4/2006 | Chang | 29/739 |
| 2008/0218966 A1 * | 9/2008 | Lang et al. | 361/689 |

FOREIGN PATENT DOCUMENTS

| | | |
|---|---|---|
| DE | 32 42 211 A1 | 5/1984 |
| DE | 36 33 625 A1 | 6/1987 |
| DE | 252 474 A1 | 12/1987 |
| DE | 202 00 484 U1 | 7/2002 |
| EP | 0 271 632 | 6/1988 |
| EP | 0 654 176 B1 | 5/1995 |
| FR | 2 664 440 | 1/1992 |
| JP | 08046381 | 2/1996 |

OTHER PUBLICATIONS

Co-Pending U.S. Appl. No. 11/886,491, filed Sep. 17, 2007; inventor Tim Kramer; title Cooling Unit.

* cited by examiner

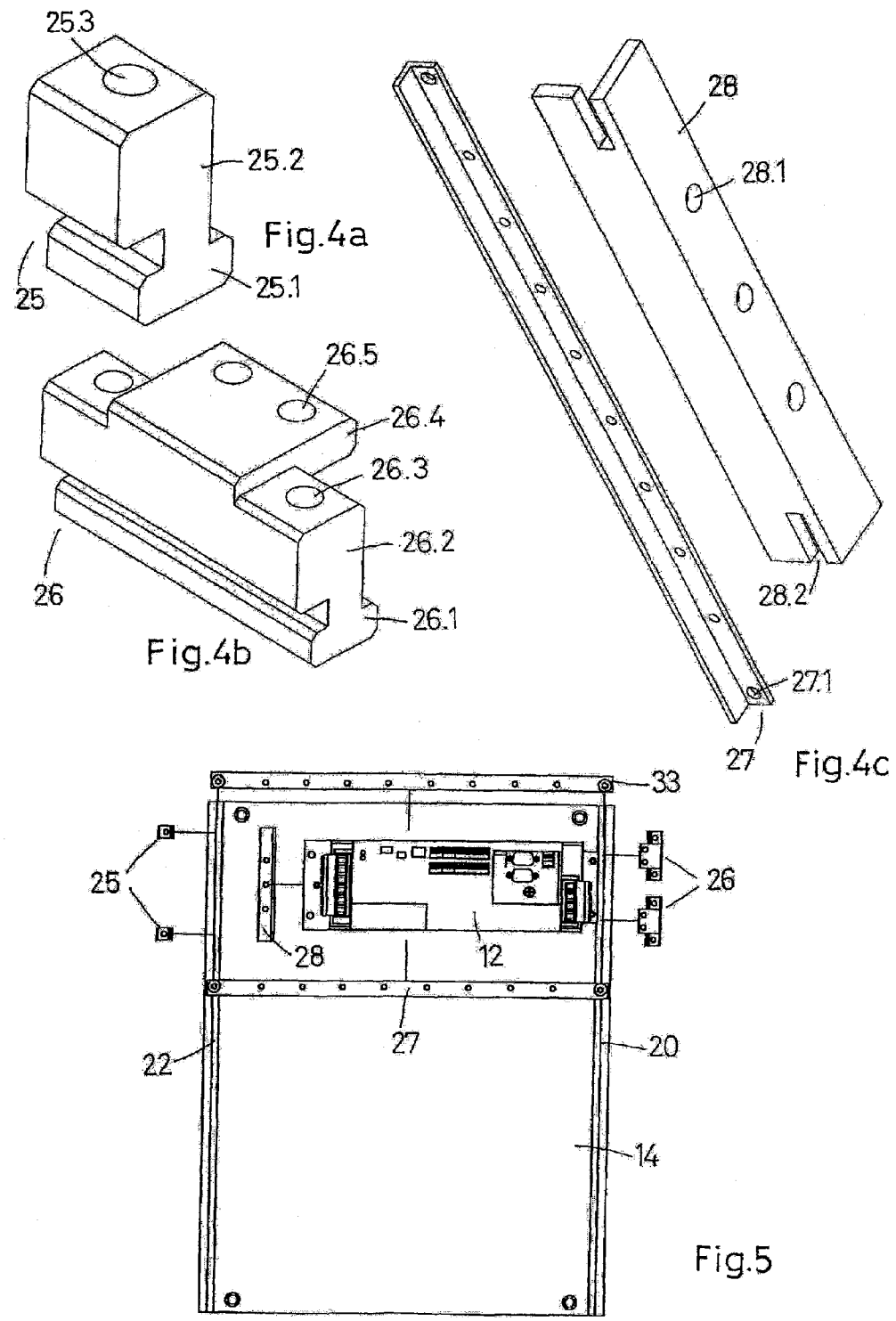

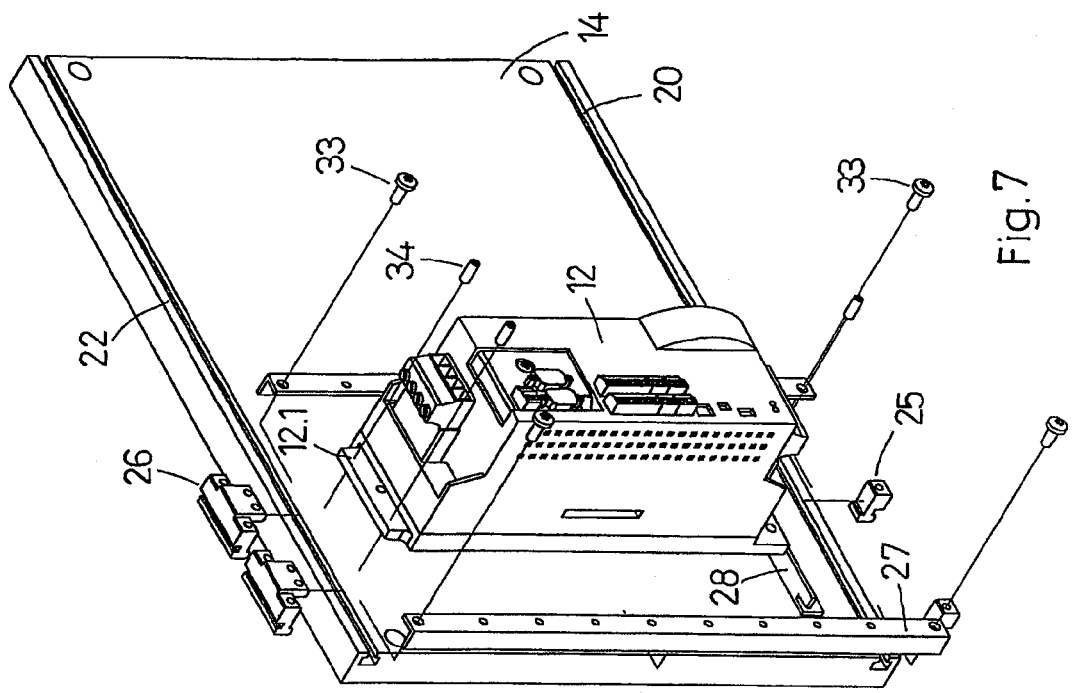
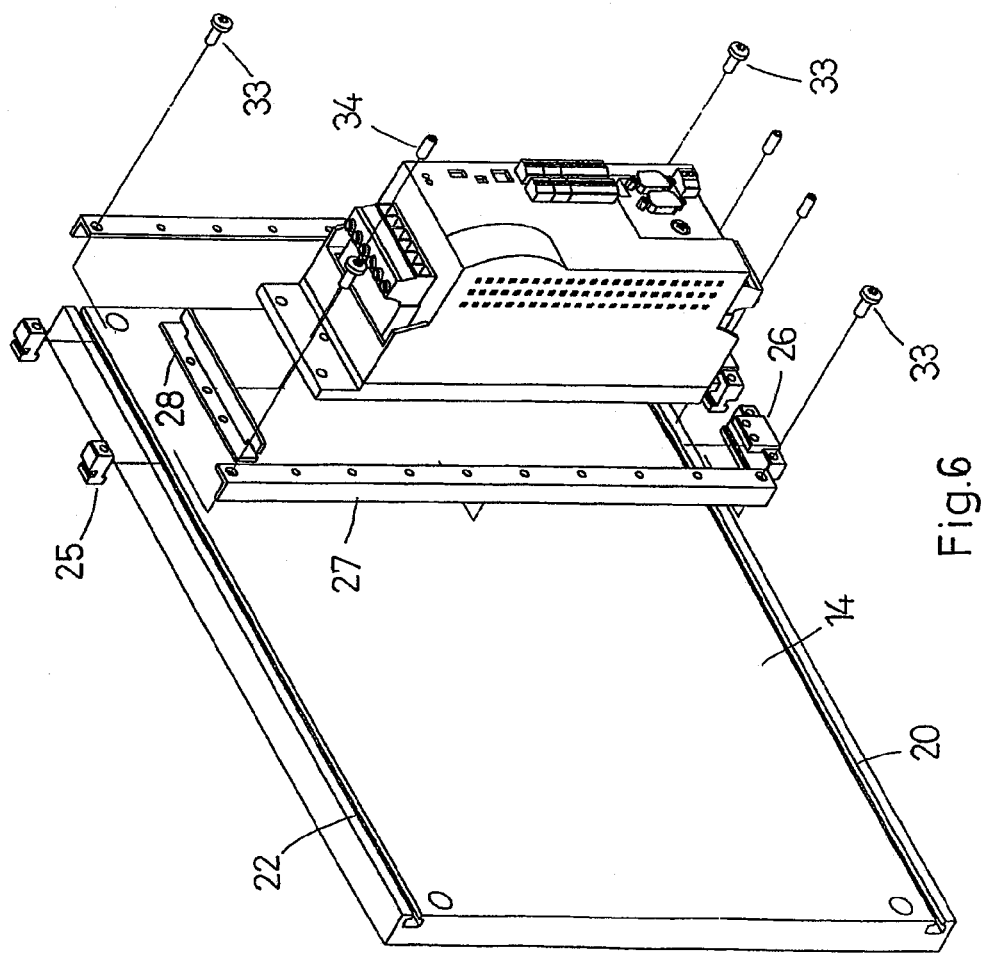

MOUNTING PLATE FOR ELECTRONIC COMPONENTS

BACKGROUND OF THE INVENTION

1. Field of the Invention

This invention relates to a mounting plate for electronic components, in particular with cooling conduits integrated in a plate body for a cooling medium to flow through, wherein a fastening arrangement for mounting the electronic components is arranged on the plate body.

2. Discussion of Related Art

It is known to insert cooling coils into a mounting plate or mounting board made of aluminum, in order to cool electronic devices, for example frequency converters, to be mounted on the mounting plate. The waste heat from the electronic components can be carried off by such a "cold plate".

The electronic components can be maintained on such a known mounting plate with screw connections. For this purpose, there are screw holes in the housings of the electronic components, through which a screw can be rotated into threaded holes to be cut into the mounting plate. Because of the cooling coils, however, holes cannot be drilled without danger of damage to the known mounting plates. Also, the electronic components often have different dimensions, so that different fastening dimensions also exist. Thus, it is often not possible to provide the mounting plate with a predetermined grid of threaded holes, because the threaded holes applied to the housings of the electronic components are not aligned with them.

In known mounting plates of the firm PADA Engineering, the cooling coils are mounted visibly on the plate surface in order to prevent accidental damage of the cooling conduits to the greatest extent during later mechanical working of the mounting plate.

However, it is necessary in connection with the known mounting plates to cut specially arranged threaded holes, depending on the fastening dimensions of the electronic component to be mounted. This requires elaborate fastening techniques.

Also, based on the mounting areas on the mounting plate predetermined by the position of the cooling coils, the component density of several electronic components to be mounted is reduced, and because of the guidance of the coolant conduits, not every position is suitable for cutting a threaded hole.

SUMMARY OF THE INVENTION

In is one object of this invention to provide a mounting plate for electronic components which, along with a reduced mounting outlay and secure holding of the electronic components to be mounted, offers variable arrangement options on the plate surface without drilling holes into it.

This object is achieved with a mounting plate having the characteristics discussed in this specification and in the claims.

Accordingly, the fastening arrangement has at least one holding element with a fastening screw thread and at least one first groove or rib, which is undercut, that extends in a straight line in the extension direction of the mounting plate, and into which the at least one holding element can be inserted for fixing the component in place. The additional cutting of threaded holes is avoided by this arrangement. Mounting can be accomplished in a simple manner wherein, because of the freely selectable positioning of the holding elements in the groove, the adaptation to the structural conditions of the components is possible.

In accordance with a further basic concept, the fastening arrangement can have at least one second groove or rib, which is embodied similar to the first groove or rib and which extends parallel with respect to the first groove or rib, whose distance from the first groove or rib is substantially determined by the length of extension of the electronic component to be mounted, which runs perpendicularly with respect to the first or second groove or rib. Thus, with a preset fastening size of electronic components to be mounted, a simple securing on the mounting plate can take place.

In accordance with one embodiment, the fastening arrangement can have at least one further groove or rib extending parallel with the second groove or rib, which is embodied in the same way as the first groove or rib and the second groove or rib and extends along the side of the second groove or rib facing away from the electronic component to be mounted at a distance from it, which is less than the distance between the first groove or rib and the second groove or rib. With this arrangement, consideration is given to an additionally used further fastening dimension of electronic components to be mounted.

Electronic components having holes for fastening with screws can be mounted in a simple manner. In this case, the electronic components can be fastened by screws directly on the holding elements inserted into the grooves or ribs, or can be fixed in place by strip-like holding elements attached indirectly or directly to the holding elements.

However, if the fastening dimensions of the electronic compounds to be mounted do not agree with the spacing between the parallel extending grooves, for example if the electronic components to be mounted have holes with spacing between each other is less than the distance between the second groove and the first groove, or less than the distance of the next further groove from the first groove, then the component can be fixed in place at least on one side by an angled sheet metal piece, wherein at least one screw engaging the angled sheet metal piece is screwed into the holding element inserted into the corresponding groove.

Here, the angled sheet metal piece can have a flat base plate for placement against the mounting plate and a clamping area, which is angled with respect to it, for the clamping fixation of the electronic component to be mounted. During this, the clamping area can clampingly engage a protrusion on the electronic component.

In order to achieve a particularly simple adaptation to different structural dimensions of electronic components to be mounted, the angled sheet metal piece can have at least one elongated hole, which extends perpendicularly with respect to the direction of extension of the second groove or the still further groove, for receiving the screw.

In one embodiment, the holding element can be a spring nut.

In view of manufacturing technology, it is advantageous if the first groove, the second groove and/or the next further groove are embodied in one piece with the plate body.

Improved arrangement and fastening possibilities result if at least one holding element is embodied as a groove insert, which has a base part that can be inserted into one of the grooves, and a top part protruding from the groove if, in the inserted state of the groove insert, the top part has a fastening section spaced apart from the mounting level of the mounting plate, which can be positioned above a base part to be located under it, of the component to be fixed in place. The distance of the fastening section can be greater than the thickness of the base part in the direction of the normal line with respect to the mounting level. At least one threaded bore is in the fastening section, into which an attachment screw, which works together with the base part, can be screwed for fixing the component in place.

Also, those steps contribute to simple secure mounting, wherein at least one holding element is made as a sliding block with a base part which can be pushed into one of the grooves, and with a top part protruding from the groove. A threaded bore is arranged in the top part in the direction of the normal line with respect to the mounting level, on which a holding means for the component can be screwed in place.

Variable fastening embodiments are possible if the fastening arrangement has at least one holding strip, which can be arranged transversely with respect to the grooves and is dimensioned so that it spans the distance between two grooves and can be fixed in place by threaded bores in its end sections on both sides in the sliding blocks and/or groove inserts pushed into the respective grooves.

An intended arrangement at practically any desired location of the mounting level without additional bores is possible if at least one strip-like bridge is provided, which can be displaceably inserted at a distance from the mounting level between two holding strips arranged on both sides of a component parallel with respect to each other, and has bores, by which the component can be fixed in place at its base by at least one attachment screw.

Here, those steps contribute to simple mounting, wherein the bridge has open slits in both its end sections in the direction toward the holding strips, by which it is displaceably held on the holding strips.

The arrangement and fastening possibilities are enhanced if there is at least one holding strip and/or bridge with a row of threaded bores or fastening holes.

The stability of the fastening arrangement is enhanced if the holding strip and/or the bridge is designed in an angular shape in cross section, or has at least one reinforcement rib.

BRIEF DESCRIPTION OF THE DRAWINGS

This invention is explained in greater detail in view of preferred embodiments shown in the drawings, wherein:

FIGS. 4*a*-4*c* show different elements of a fastening arrangement in partial views;

FIG. 5 shows a mounting arrangement in a top schematic plan view with a mounting plate, a component to be fastened, and the elements of the fastening arrangement in accordance with FIG. 4;

FIG. 6 shows a perspective plan view of the arrangement shown in FIG. 5, from one side; and FIG. 7 shows a perspective plan view of the arrangement in accordance with FIG. 5, from an opposite side with respect to FIG. 6.

DESCRIPTION OF PREFERRED EMBODIMENTS

Figure 1:
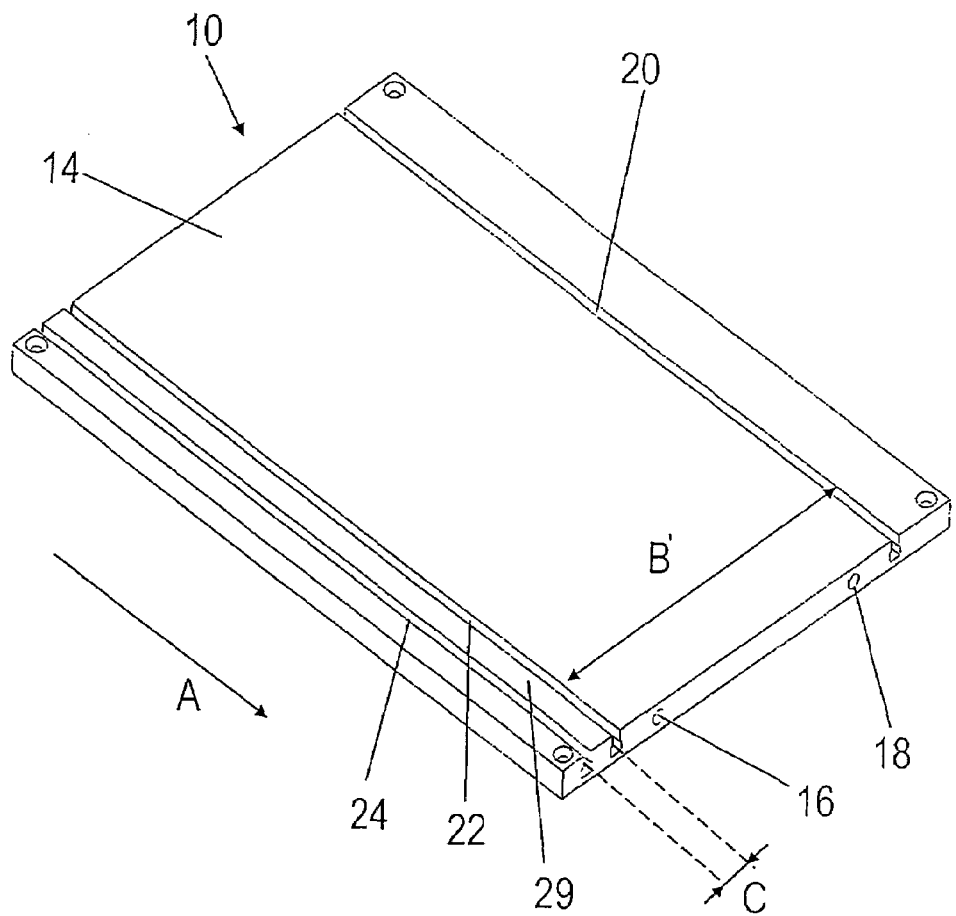
FIG. 1 shows a mounting plate in a schematic and perspective lateral view without electronic components to be mounted and to be cooled.

In a schematic and perspective lateral view, FIG. 1 shows a mounting plate 10 without electronic components which are to be mounted on it and to be cooled. The mounting plate 10 has a flat plate body 14 made, for example, of aluminum, in which a cooling circuit is embodied with connectors 16 and 18 in the form of a cooling coil, not shown, for the flow-through of a cooling fluid. In the area in which the cooling fluid coil is integrally deployed, the plate body 14 is not additionally processed, but instead is designed flat and level. On the side to the right in FIG. 1, of the area in which the cooling fluid coil is integrally placed, an undercut first groove 20 is formed in one piece with the plate body, which is approximately C-shaped in cross section and extends in a straight line in the direction (arrow A) of extension of the mounting plate 14. At least one holding element, for example a spring nut (not represented), a sliding block 25 (FIG. 4*a*), and/or a groove insert (FIG. 4*b*) for providing a screw connection with an electronic component 12, or further elements of a fastening arrangement, can be inserted, preferably fixed against relative rotation, into the first groove 20. The electronic components to be installed can then be securely fixed in suitable positions.

Parallel with the first groove 20, an undercut second groove 22 extends at the side of the area of the plate body on the left in FIG. 1, in which the cooling coil is integrally deposited. The distance between the first groove 20 and the second groove 22 is defined by the area of the plate body in which the cooling coil is integrally deposited, and by the length of extension perpendicularly with respect to the first groove 20 and the second groove 22 of an electronic component to be mounted.

An undercut further groove 24 extends parallel with the first groove 20 and the second groove 22, which extends at a distance C with respect to a side 29 of the second groove 22 facing away from the component to be mounted. The distance C is less than the distance B between the first groove 20 and the second groove 22, and is matched to a different fastening dimension than the second groove 22.

Electronic components to be mounted, whose enclosures or housings have screw holes whose distance from each other corresponds to the distance B of the second groove 22 from the first groove 20, or of the still further groove 24 from the first groove 20, can be directly fastened by screws on nuts inserted into the grooves 20, 22, 24.

Figure 2:
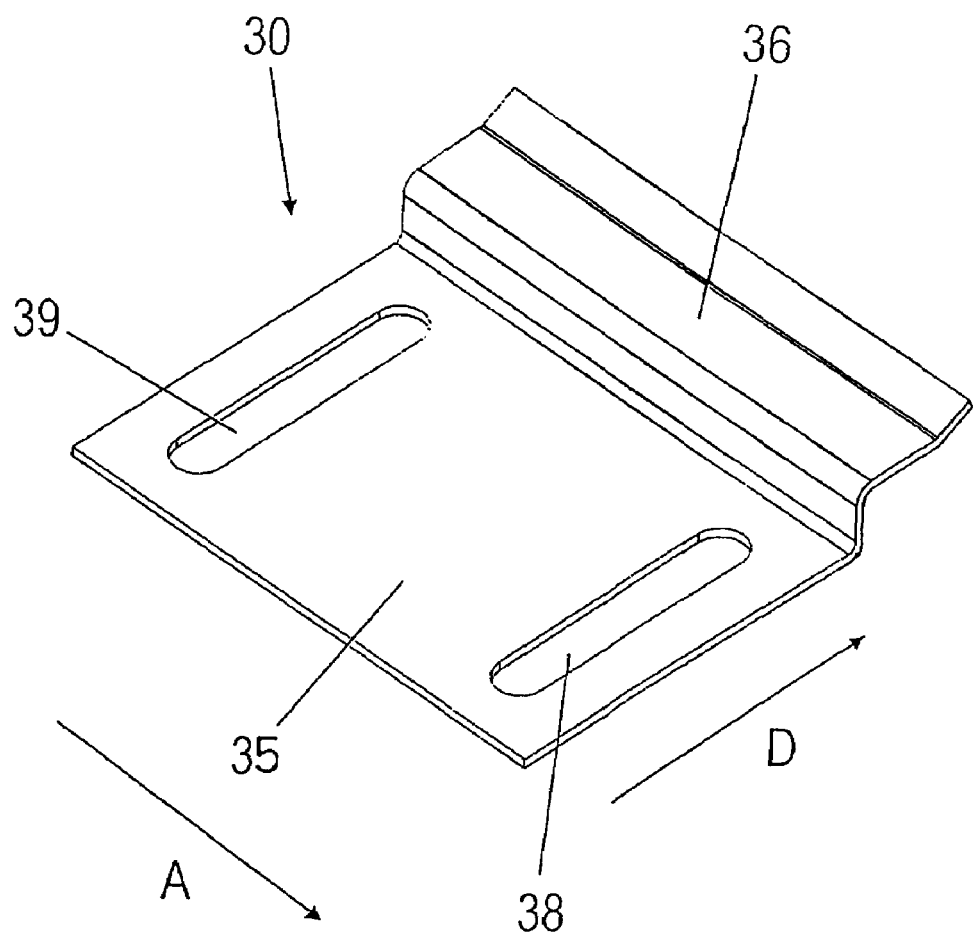
FIG. 2 shows an angled sheet metal piece in a schematic and perspective lateral view, for mounting which can be matched to different fastening dimensions of electronic components to be mounted.

In a schematic and perspective lateral view, FIG. 2 shows an angled sheet metal piece 30 for mounting, which can be matched to different fastening dimensions of electronic components to be mounted.

Electronic components to be mounted, whose housings have screw holes with distance from each other that is less than the distance B' (represented in FIG. 1) of the first groove 20 from the second groove 22, or less than the distance of the next further groove 24 from the first groove 20, can be clampingly fixed in place at least on one side through the angled sheet metal piece 30 by a screw (not represented) engaging the piece on screw nuts introduced into the appropriate groove 22.

The angled sheet metal piece 30 has a flat base plate 35 for placement against the mounting plate 10, and a clamping area 36 angled with respect to it and made of one piece for the clamping fixation of the electronic component to be mounted.

The angled sheet metal piece 30 has two elongated holes 38 and 39, which run perpendicularly (arrow D) with respect to the extension direction (arrow A) of the second groove 22, or the still further groove 24, for receiving a screw (not represented).

Figure 3:
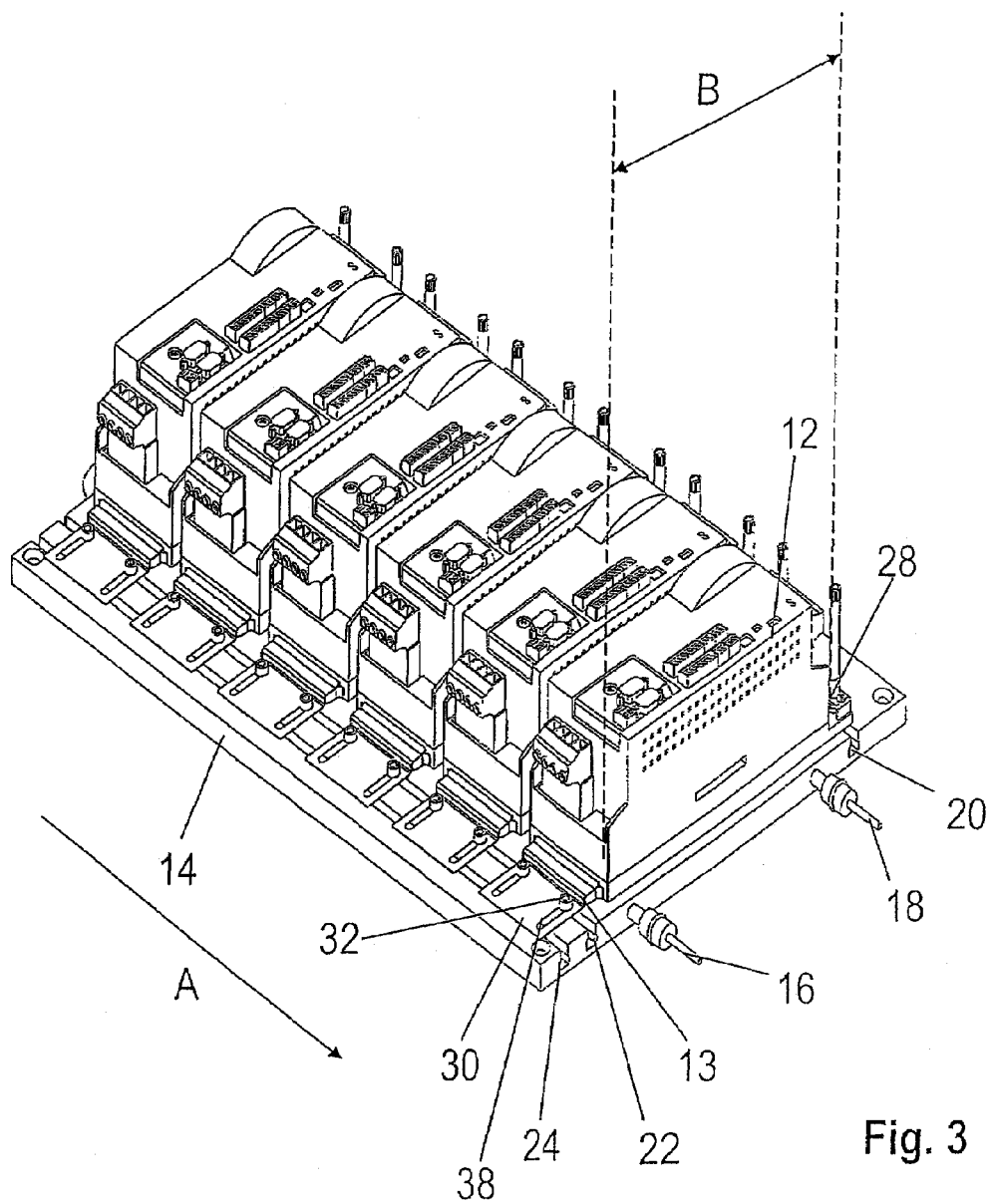
FIG. 3 shows the mounting plate in accordance with FIG. 1, in a schematic and perspective lateral view, with frequency converters which are to be cooled, mounted thereon, each of which is clampingly held on one side by an angle iron, in accordance with FIG. 2.

In a schematic and perspective lateral view, FIG. 3 shows the mounting plate 10 in accordance with FIG. 1 with frequency converters 12, which are to be cooled, mounted thereon, each of which is clampingly held on one side by an angled sheet metal piece 30 in accordance with FIG. 2.

The frequency converters whose extension B does not match the distance between the two grooves 20 and 22 are each screwed together on the right side in FIG. 3 by screws, which engage spring nuts (not represented) inserted into the groove 20. Such a screw has the reference numeral 28 in FIG. 3.

On the left side in FIG. 3, the frequency converters 12 are each clamped by an additional angled sheet metal piece, one of which is represented by the reference numeral 30. For example, in the elongated hole 38 of the represented angled sheet metal piece 30, a screw 32 engages a spring nut (not represented) introduced into the second groove 22. The angled sheet metal piece 30 clampingly engages a protrusion 13 on the housing of the frequency converter 12. The fastening dimension, which does not fit the spacing between the grooves, is compensated by the fastening through the elongated hole.

In the partial views FIGS. 4a to 4d, each shows different elements of a fastening arrangement, a sliding block 25 (partial view a), a groove insert 26 (partial view b), a holding strip (partial view c), and a strip-like bridge 28 (partial view d), which may be provided in greater or lesser numbers for forming a kit. It is thus possible to fix components of different dimensions and/or in different positions in place on the mounting level of the mounting plate 10. The mounting principle ensues from FIGS. 5, 6 and 7. No fastening bores are required in the mounting plate.

As shown in FIG. 4a, for insertion into a groove 20, 22, 24 which is T-shaped in cross section, the sliding block 25 has a T-shaped base section 25.1 matched to the groove cross section, as well as a top section 25.2 extending from the groove past or beyond the mounting level, into whose top a threaded bore 25.3 is cut in the direction of the normal line with respect to the mounting level. Also possible are lateral threaded bores parallel with the mounting level. The sliding block 25 is displaceably seated in the groove by the base section 25.1.

In a manner corresponding to the sliding block 25, the groove insert 26 in FIG. 4b also has base section 26.1, T-shaped in cross section and matched to the groove cross section, as well as a top section 26.2 projecting from the groove, but is longer in the groove direction than the sliding block 25 and also has a fastening section 26.4, which protrudes transversely to the groove direction and is spaced apart from the mounting level in the inserted state. Threaded bores 26.3 and 26.5 are cut in the direction of the normal line from above into its two end sections, as well as into the fastening section 26.4.

As FIG. 4c shows, the holding strip 27 is in an angular shape in cross section and has a number of bores 27.1 in its one leg, at least some of which can also be embodied as threaded bores. The bridge 28 represented in FIG. 4d is also angular in cross section and also has a number of bores which can be designed as threaded bores. Furthermore, open slits 28.2, open toward the ends, are cut in the leg without the bores 28.1 on both sides parallel with the longitudinal extension.

As FIGS. 5,6 and 7 show, the angular strips 27 are somewhat longer than the distance between the two grooves 20, 22 extending in the vicinity of the two longitudinal edges, and they can be selectively fastened in appropriate positions on sliding blocks 25, or groove inserts 26, by insertion into the grooves 20, 22 by the introduction of screws 33 through the respective bores 27.1 of the holding strip 27 and can be tightly screwed into threaded bores 25.3 or 26.3, wherein the side of the holding strip 27 with the bores 27.1 preferably forms the top side. The holding strips 27 can thus be displaced in the longitudinal direction of the mounting plate 10 or the mounting level in order to arrange the component 12 in the desired linear position on the mounting level. A base part 12.1 of the component 12 can here be fixed in place by the facing fastening section 26.4 of a groove insert 26 if an attachment screw is rotated through the threaded bore 26.5 in the fastening section 26.4 for pressing the component 12 against the mounting level, by which a good contact for removing waste heat results.

At least one bridge 28 can be arranged in a desired position in the transverse direction of the mounting plate 10 between two holding strips 27, and is displaceable in the transverse direction along the holding strips 27 by the slits 28.2. In this case, the leg of the bridge 28 having bores 28.1 is farther spaced apart from the mounting level than the dimension of the respective base part 12.1 of the component 12 in the direction of the normal line of the mounting level, so that the base part 12.1 can be pushed under the bridge 28 and fastened by turning in or rotating attachment screws through the bores 28.1. Threaded pins, for example, can be used as attachment screws 34.

Several options exist for fixing the component 12 in place on the mounting plate 10, namely, for example, clamping the base part 12.1 on one side by at least one groove insert 26 under its fastening section 26.4 on the one side, and clamping in place by a bridge 28 on the other side, or clamping the base part 12.1 on both sides of the component 12 by respective bridges 28. Components 12 of different dimensions can be attached in different positions in the x/y direction of the mounting plate 10 by several holding strips 27 and bridges 28 and, if required, groove inserts 26, so that the components can be positioned in a simple manner at suitable unoccupied locations, for example inside a housing receiving the mounting plates 10. When fastening in place, the angle-shaped cross section of the holding strip 27 and the bridge 28 results in increased stability. A similar stability effect can also be achieved with a T-shaped cross section, or at least one reinforcement rib.

What is claimed is:

1. A mounting plate (10) for electronic components (12) having cooling conduits (16, 18) integrated in a plate body (14) for a cooling medium to flow through, wherein a fastening arrangement for mounting the electronic components is arranged on the plate body (14), the mounting plate comprising: the fastening arrangement includes a first holding element (25, 26) with a first fastening screw thread (25.3, 26.5) and at least one of a first groove (20) or a first rib, to be undercut, extending in a straight line in an extension direction (A) of the mounting plate (10), and into which the at least one holding element (25, 26) is insertable for fixing an electronic component (12) in place; the fastening arrangement includes a second holding element (25, 26) with a second fastening screw thread (25.3, 26.5) and at least one of a second groove (22) or a second rib similar to the first groove (20) or the first rib and extending parallel with respect to the first groove (20) or the first rib, with a distance (B') from the first groove (20) or rib substantially determined by a length of extension (B) of the electronic component (12) to be mounted, which runs perpendicularly with respect to the first or second grooves (20, 22) or the first or second ribs; and the fastening arrangement includes at least one holding strip (27) which can be arranged transversely with respect to the first groove (20) and the second groove (22) and is dimensioned to span the distance between the first groove (20) and the second groove (22) and can be fixed in place in end sections on both sides by threaded bores (25.3, 26.3) in the first holding element (25, 26) pushed into the first groove (20) and the second holding element (25, 26) pushed into the second groove (22).

2. The mounting plate in accordance with claim 1, wherein the fastening arrangement has at least one of a further groove (24) or a further rib extending parallel with the second groove (22) or the second rib, similar to the first groove or the first rib (20) and the second groove (22) or the second rib, which extends along the side (29) of the second groove (22) or the second rib facing away from the electronic component to be mounted at a distance (C) which is less than the distance (B) between the first groove (20) or the first rib and the second groove (22) or the second rib.

3. The mounting plate in accordance with claim 2, wherein the electronic components (12), which have screw holes, can be fastened by screws (33, 34) directly on the holding elements (25, 26) inserted into the grooves (20, 22, 24) or the ribs, or can be fixed in place by the at least one holding strip attached one of indirectly and directly to the holding elements (25, 26).

4. The mounting plate in accordance with claim 3, wherein the fastening arrangement comprises at least one angled sheet metal piece (30), and the electronic components (12) having holes with a spacing between each other that is one of less than the distance (B) between the second groove (22) and the first groove (20), and less than the distance of the further groove (24) from the first groove (20), can be clampingly fixed in place at least on one side by an angled sheet metal piece (30) with at least one screw (32) engaged at the holding element inserted into the corresponding groove (22).

5. The mounting plate in accordance with claim 4, wherein the angled sheet metal piece (30) has a flat base plate (34) for placement against the mounting plate (10), and a clamping area (36), which is angled with respect to it, for the clamping fixation of the electronic component (12) to be mounted.

6. The mounting plate in accordance with claim 5, wherein the angled sheet metal piece (30) has at least one elongated hole (38) which extends perpendicularly (D) with respect to the direction (A) of extension of the second groove (22) or the still further groove (24), for receiving the screw (32).

7. The mounting plate in accordance with claim 6, wherein the holding element is a spring nut.

8. The mounting plate in accordance with claim 7, wherein at least one of the first groove (20), the second groove (22) and the next further groove (24) are embodied in one piece with the plate body.

9. The mounting plate in accordance with claim 2, wherein at least one of the holding elements is a sliding block (25) with a base part (25.1) which can be pushed into one of the grooves (20, 22, 24), and a top part (25.2) protruding from the groove (20, 22, 24), and one of the threaded bores (25.3) is arranged in the top part (25.2).

10. The mounting plate in accordance with claim 1, wherein at least one holding element is a sliding block (25) with a base part (25.1) which can be pushed into one of the grooves (20, 22, 24), and a top part (25.2) protruding from the groove (20, 22, 24), and one of the threaded bores (25.3) is arranged in the top part (25.2).

11. The mounting plate in accordance with claim 1, wherein at least one strip-like bridge (28) is displaceably insertable at a distance from the mounting level between two holding strips (27), which are arranged on both sides of the electronic component (12) parallel with respect to each other, and has bores (28.1) by which the electronic component (12) can be fixed in place at a base (12.1) by at least one attachment screw.

12. The mounting plate in accordance with claim 11, wherein the bridge (28) has open slits (28.2) in both end sections toward the holding strips (27), by which it is displaceably held on the holding strips (27).

13. The mounting plate in accordance with one of claim 12, wherein at least one of the holding strip (27) and the bridge (28) has a row of threaded bores (27.1, 28.1) or a row of fastening holes.

14. The mounting plate in accordance with claim 13, wherein at least one of the holding strip (27) and the bridge (28) is designed in an angular shape in cross section, or has at least one reinforcement rib.

15. The mounting plate in accordance with claim 1, wherein the electronic components (12), which have screw holes, can be fastened by screws (33, 34) directly on the holding elements (25, 26) inserted into the grooves (20, 22, 24) or the ribs, or can be fixed in place by the at least one holding strip (27).

16. The mounting plate in accordance with claim 1, wherein the fastening arrangement comprises at least one angled sheet metal piece (30), and the electronic components (12) having holes with a spacing between each other that is one of less than the distance (B) between the second groove (22) and the first groove (20), and less than the distance of a further groove (24) from the first groove (20), can be clampingly fixed in place at least on one side by an angled sheet metal piece (30) with at least one screw (32) engaging at the holding element inserted into the corresponding groove (22).

17. The mounting plate in accordance with claim 16, wherein the holding element is a spring nut.

18. The mounting plate in accordance with claim 1, wherein at least one of the first groove (20), the second groove (22) and a further groove (24) are embodied in one piece with the plate body.

19. The mounting plate in accordance with claim 1, wherein at least one strip-like bridge (28) is displaceably insertable at a distance from the mounting level between two holding strips (27), which are arranged on both sides of the electronic component (12) parallel with respect to each other, and at least one of the holding strip (27) and the bridge (28) is designed in an angular shape in cross section, or has at least one reinforcement rib.

20. The mounting plate in accordance with claim 1, wherein the at least one holding element is embodied as a groove insert (26) which includes a base part (26.1) insertable into the first groove (20), a top part (26.2) protruding from the first groove (20) and including the threaded bores (26.3), and a fastening section (26.4) protruding transversely from the top part (26.2) and spaced apart from a mounting level of the mounting plate (10), when inserted the groove insert (26) can be positioned over a portion of the electronic component (12) to be secured, the fastening section (26.4) being spaced apart from the mounting level a distance greater than a thickness of the portion of the electronic component (12) in a direction perpendicular to the mounting level, and the fastening section (26.4) includes at least one threaded bore (26.5) into which an attachment screw (34) can be rotated for fixing the electronic component (12) in place.

21. A mounting plate (10) for electronic components (12) having cooling conduits (16, 18) integrated in a plate body (14) for a cooling medium to flow through, wherein a fastening arrangement for mounting the electronic components is arranged on the plate body (14), the mounting plate comprising: the fastening arrangement having at least one holding element (25, 26) with a fastening screw thread (25.3, 26.5) and at least one of a first groove (20) or a first rib, to be undercut, extending in a straight line in an extension direction (A) of the mounting plate (10), and into which the at least one holding element (25, 26) is insertable for fixing an electronic component (12) in place, wherein at least one holding element is embodied as a groove insert (26) which includes a base part (26.1) insertable into the first groove (20), a top part (26.2) protruding from the first groove (20) and a fastening section (26.4) protruding transversely from the top part (26.2) and spaced apart from a mounting level of the mounting plate (10) and the fastening section (26.4) includes at least one threaded bore (26.5) into which an attachment screw (34) can be rotated for fixing the electronic component (12) in place; the fastening arrangement having at least one of a second groove (22) or a second rib similar to the first groove (20) or the first rib and extending parallel with respect to the first groove (20) or the first rib, with a distance (B') from the first groove (20) or the first rib substantially determined by a length of extension (B) of the electronic component (12) to be mounted, which runs perpendicularly with respect to the first or second grooves (20, 22) or the first or second ribs; the fastening arrangement having at least one of a further groove (24) or a further rib extending parallel with the second groove (22) or the second rib, similar to the first groove (20) or the first rib and the second groove (22) or the second rib, which extends along the side (29) of the second groove (22) or the second rib facing away from the electronic component to be mounted at a distance (C) which is less than the distance (B) between the first groove (20) or the first rib and the second groove (22) or the second rib, wherein at least one of the first groove (20), the second groove (22) or the further groove (24) is embodied in one piece with the plate body; wherein the electronic components (12), which have screw holes, can be fastened by screws (33, 34) directly on the holding elements (25, 26) inserted into the grooves (20, 22, 24) or the ribs, or can be fixed in place by strip-like holding elements (27, 28), which are attached one of indirectly and directly to the holding elements (25,26); the fastening arrangement comprising at least one angled sheet metal piece (30), and the electronic components (12) having holes with a spacing between each other that is one of less than the distance (B) between the second groove (22) and the first groove (20), and less than the distance of the further groove (24) from the first groove (20), can be clampingly fixed in place at least on one side by an angled sheet metal piece (30) with at least one screw (32) engaging a spring nut inserted into a corresponding groove (22), the angled sheet metal piece (30) having a flat base plate (35) for placement against the mounting plate (10), a clamping area (36), which is angled with respect to it, for the clamping fixation of the electronic component (12) to be mounted, and at least one elongated hole (38) which extends perpendicularly (D) with respect to the direction (A) of extension of the second groove (22) or the still further groove (24), for receiving the screw (32); the fastening arrangement has at least one holding strip (27) which can be arranged transversely with respect to the grooves (20, 22, 24) and is dimensioned to span the distance between two grooves (20, 22; 20, 24) and can be fixed in place in end sections on both sides by threaded bores (25.3, 26.3) in at least one of the sliding blocks (25) and groove inserts (26) pushed into the respective grooves (20, 22, 24).

22. The mounting plate in accordance with claim 21, wherein at least one strip-like bridge (28) is displaceably insertable at a distance from the mounting level between two holding strips (27), which are arranged on both sides of the electronic component (12) parallel with respect to each other, and at least one of the holding strip (27) and a bridge (28) has a row of threaded bores (27.1, 28.1) or a row of fastening holes.

23. A mounting plate (10) for electronic components (12) having cooling conduits (16, 18) integrated in a plate body (14) for a cooling medium to flow through, wherein a fastening arrangement for mounting the electronic components is arranged on the plate body (14), the mounting plate comprising: the fastening arrangement having at least one holding element (25, 26) with a fastening screw thread (25.3, 26.5) and at least one of a first groove (20) or a first rib, to be undercut, extending in a straight line in an extension direction (A) of the mounting plate (10), and into which the at least one holding element (25, 26) is insertable for fixing an electronic component (12) in place, wherein the at least one holding element is embodied as a groove insert (26) which includes a base part (26.1) insertable into the first groove (20), a top part (26.2) protruding from the first groove (20) and a fastening section (26.4) protruding transversely from the top part (26.2) and spaced apart from a mounting level of the mounting plate (10) and the fastening section (26.4) includes at least one threaded bore (26.5) into which an attachment screw (34) can be rotated for fixing the electronic component (12) in place; the fastening arrangement having at least one of a second groove (22) or a second rib similar to the first groove (20) or the first rib and extending parallel with respect to the first groove (20) or the first rib, with a distance (B') from the first groove (20) or rib substantially determined by a length of extension (B) of the electronic component (12) to be mounted, which runs perpendicularly with respect to the first or second grooves (20,22) or the first or second ribs; the fastening arrangement having at least one of a further groove (24) or a further rib extending parallel with the second groove (22) or the second rib, similar to the first groove or the first rib (20) and the second groove (22) or the second rib, which extends along the side (29) of the second groove (22) or the second rib facing away from the electronic component to be mounted at a distance (C) which is less than the distance (B) between the first groove (20) or the first rib and the second groove (22) or the second rib, wherein at least one of the first groove (20), the second groove (22) or the further groove (24) is embodied in one piece with the plate body; wherein the electronic components (12), which have screw holes, can be fastened by screws (33, 34) directly on the holding elements (25, 26) inserted into the grooves (20, 22, 24) or the ribs or can be fixed in place by strip-like holding elements (27, 28), which are attached one of indirectly and directly to the holding elements (25,26); the fastening arrangement comprising at least one angled sheet metal piece (30), and the electronic components (12) having holes with a spacing between each other that is one of less than the distance (B) between the second groove (22) and the first groove (20), and less than the distance of the further groove (24) from the first groove (20), can be clampingly fixed in place at least on one side by an angled sheet metal piece (30) with at least one screw (32) engaging a spring nut inserted into a corresponding groove (22), the angled sheet metal piece (30) having a flat base plate (35) for placement against the mounting plate (10), a clamping area (36), which is angled with respect to it, for the clamping fixation of the electronic component (12) to be mounted, and at least one elongated hole (38) which extends perpendicularly (D) with respect to the direction (A) of extension of the second groove (22) or the still further groove (24), for receiving the screw (32); the fastening arrangement comprising at least one holding element that is a sliding block (25) with a base part (25.1) which can be pushed into one of the groove (20, 22, 24), and a top part (25.2) protruding from the groove (20, 22, 24), and a threaded bore (25.3) is arranged in the top part (25.2) in a normal direction with respect to the mounting level, on which a holding for the electronic component (12) can be screwed in place; and the fastening arrangement comprising at least one holding strip (27) which can be arranged transversely with respect to the grooves (20, 22, 24) and is dimensioned to span the distance between two of the grooves (20, 22; 20, 24) and can be fixed in place in end sections on both sides by threaded bores (25.3, 26.3) in at least one of the sliding blocks (25) and the groove inserts (26) pushed into the respective grooves (20, 22, 24).

* * * * *